(12) United States Patent
Kim et al.

(10) Patent No.: US 7,809,220 B2
(45) Date of Patent: Oct. 5, 2010

(54) PRINTED CIRCUIT BOARD AND MANUFACTURING METHOD THEREOF

(75) Inventors: Sang-Hoon Kim, Gunpo-si (KR);
Je-Gwang Yoo, Yongin-si (KR);
Joon-Sung Kim, Suwon-si (KR);
Jae-Hyun Jung, Ansan-si (KR);
Han-Seo Cho, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/219,135

(22) Filed: Jul. 16, 2008

(65) Prior Publication Data

US 2009/0208164 A1 Aug. 20, 2009

(30) Foreign Application Priority Data

Feb. 19, 2008 (KR) .................. 10-2008-0014961

(51) Int. Cl.
*G02B 6/12* (2006.01)
(52) U.S. Cl. .......................... 385/14; 385/129
(58) Field of Classification Search ............ None
See application file for complete search history.

(56) References Cited

U.S. PATENT DOCUMENTS

2004/0218848 A1* 11/2004 Shen et al. ............ 385/14
2004/0264837 A1* 12/2004 Ogawa ................... 385/14
2007/0086696 A1* 4/2007 Hsu ...................... 385/14
2007/0104413 A1* 5/2007 Hsu ...................... 385/14
2008/0107375 A1* 5/2008 Yonekura et al. ........ 385/14
2009/0028497 A1* 1/2009 Kodama et al. ......... 385/14

FOREIGN PATENT DOCUMENTS

KR 10-0796982 1/2008

OTHER PUBLICATIONS

Korean Office Action issued Oct. 21, 2009 in corresponding Korean Patent Applicatiion 10-2008-0014961.

* cited by examiner

*Primary Examiner*—Sung H Pak

(57) ABSTRACT

A printed circuit board and a method of manufacturing the printed circuit board are disclosed. The printed circuit board can include: an optical waveguide, in one side of which a circuit pattern and a pad are buried; an insulation layer stacked over one side of the optical waveguide; a first insulating material stacked over the insulation layer; a first electrical wiring layer stacked over the first insulating material; a second insulating material stacked over the other side of the optical waveguide; a second electrical wiring layer stacked over the second insulating material; and a via penetrating the optical waveguide. Certain embodiments of the invention enable the efficient transmission of optical and electrical signals, reduce loss in the optical signals transferred to the photoelectric converters, and allow more efficient designs for the wiring in the board.

10 Claims, 16 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2008-0014961 filed with the Korean Intellectual Property Office on Feb. 19, 2008, the disclosure of which is incorporated herein by reference in its entirety.

BACKGROUND

1. Technical Field

The present invention relates to a printed circuit board and to a method of manufacturing the printed circuit board.

2. Description of the Related Art

The rigid-flexible printed circuit board is widely being used in mobile electronic products such as cell phones, etc., and in network equipment. The demand for flexibility in the printed circuit board is especially high in mobile electronic products, as they may require operability in fold type or slide type structures or in more complicated structures.

Compared to the board that uses only electrical copper wiring, the board that utilizes optical signals may be less affected by EMI (electromagnetic interference) and EMC (electromagnetic compatibility) and may hence be more resistant to external noise, to thereby allow the transfer of high-speed signals with low loss.

An example of a conventional structure for embedding an optical waveguide in a flexible or a rigid-flexible printed circuit board is illustrated in FIG. 1.

FIG. 1 is a cross sectional view of a printed circuit board according to the related art. In FIG. 1, there are illustrated an optical waveguide 1, a core 2, a cladding 3, insulation films 4, connection pads 5, photoelectric converters 6, a solder resist 7, and solder balls 8.

A printed circuit board according to the related art may include an electrical wiring layer, on which to mount the photoelectric converters, on the upper surface of the optical waveguide 1. This layer structure may be positioned on the uppermost surface of a multilayer board.

Here, a solder resist 7 may be coated over the electrical wiring layer on the uppermost side, with portions corresponding to the pads 5 uncovered to allow connection between the photoelectric converters 6 and the solder balls 8.

This configuration, however, may result in long distances between the photoelectric converters 6 and the optical wiring, and may thus lower the efficiency of the optical connections. Also, when mounting the photoelectric converters 6, it may be necessary to uncover the portions of the solder resist 7 corresponding to the pads 5, as well as the portions between the photoelectric converters and the optical reflector parts. Here, a high level of precision may be required to align the optical wiring and the optical reflector parts.

SUMMARY

An objective of the invention is to provide a printed circuit board and a method of manufacturing the printed circuit board, which provide improved performance and efficiency in transmitting optical and electrical signals, and which allow easier wiring design.

An aspect of the invention provides a printed circuit board that includes: an optical waveguide, in one side of which a circuit pattern and a pad are buried; an insulation layer stacked over one side of the optical waveguide; a first insulating material stacked over the insulation layer; a first electrical wiring layer stacked over the first insulating material; a second insulating material stacked over the other side of the optical waveguide; a second electrical wiring layer stacked over the second insulating material; and a via penetrating the optical waveguide.

Here, an optical waveguide can include a core, through which optical signals may travel, and a cladding, which may cover the core. The first electrical wiring layer and the second electrical wiring layer can each include a flexible insulation layer, and a circuit pattern formed on the flexible insulation layer. The via can be structured to electrically connect the circuit pattern of the first electrical wiring layer, the circuit pattern of the second electrical wiring layer, and the circuit pattern buried in the optical waveguide.

Portions of the first insulating material and the second insulating material may be removed, in order that the optical waveguide, the first electrical wiring layer, and the second electrical wiring layer may be bendable. Parts of the first electrical wiring layer and the first insulating material may be perforated in positions corresponding to the pad, while a portion of the insulation layer may be uncovered in a position corresponding to the pad, so that the pad may be exposed. Thus, the printed circuit board can be structured in such a way that allows the photoelectric converters to access the optical waveguide.

The insulation layer can be made of a flexible material. Also, the insulation layer can be made of a material containing a light-transmissive substance, to allow an efficient transfer of optical signals to the photoelectric converters.

In certain embodiments, the printed circuit board may further include a third insulating material stacked over the second electrical wiring layer, and a third electrical wiring layer stacked over the third insulating material. Here, the third electrical wiring layer can include a flexible insulation layer, and a circuit pattern formed on the flexible insulation layer.

In such cases, the via can be structured to electrically connect the circuit pattern of the first electrical wiring layer, the circuit pattern of the second electrical wiring layer, the circuit pattern of the third electrical wiring layer, and the circuit pattern buried in the optical waveguide.

Also provided is a printed circuit board that includes: a first optical waveguide, in one side of which a circuit pattern and a pad are buried; a first insulation layer stacked over one side of the first optical waveguide; a first insulating material stacked over the first insulation layer; a first electrical wiring layer stacked over the first insulating material; a second optical waveguide, in one side of which a circuit pattern and a pad are buried; a second insulation layer stacked over one side of the second optical waveguide; a second insulating material stacked over the second insulation layer; a second electrical wiring layer stacked over the second insulating material; an intermediate layer interposed between the other side of the first optical waveguide and the other side of the second optical waveguide, such that the first optical waveguide and the second optical waveguide are attached; and a via penetrating the first optical waveguide and the second optical waveguide.

The first insulation layer and the second insulation layer can be made of flexible materials.

The first optical waveguide and the second optical waveguide can each be formed as a structure that includes a core, through which optical signals may travel, and a cladding, which may cover the core. The first electrical wiring layer and the second electrical wiring layer can each be formed as a structure that includes a flexible insulation layer, and a circuit pattern formed on the flexible insulation layer.

Here, the via can be structured to electrically connect the circuit pattern buried in the first optical waveguide, the circuit pattern buried in the second optical waveguide, the circuit pattern of the first electrical wiring layer, and the circuit pattern of the second electrical wiring layer.

Portions of the first insulating material, the second insulating material, and the intermediate layer may be removed, in order that the first optical waveguide, the first electrical wiring layer, the second optical waveguide, and the second electrical wiring layer may be bendable. Parts of the first electrical wiring layer and the first insulating material may be perforated in positions corresponding to the pad buried in the first optical waveguide, while a portion of the insulation layer may be uncovered in a position corresponding to the pad buried in the first optical waveguide, so that the pad may be exposed.

The first insulation layer may be made of a material that contains a light-transmissive substance.

The intermediate layer can include a third electrical wiring layer, and a third insulating material stacked over either side of the third electrical wiring layer, where the third electrical wiring layer can be structured to include a flexible insulation layer, and a circuit pattern formed on the flexible insulation layer.

In such cases, the via can be structured to electrically connect the circuit pattern buried in the first optical waveguide, the circuit pattern buried in the second optical waveguide, the circuit pattern of the first electrical wiring layer, the circuit pattern of the second electrical wiring layer, and the circuit pattern of the third electrical wiring layer.

Another aspect of the invention provides a method of manufacturing a printed circuit board that includes: providing an optical waveguide, which has a circuit pattern and at least one pad buried in one side, and which has an insulation layer stacked over one side; stacking a first insulating material and a first metal clad laminate, each of which has portions perforated in positions corresponding to the pad, over the insulation layer, and stacking a second insulating material and a second metal clad laminate over the other side of the optical waveguide; exposing the pad by uncovering a portion of the insulation layer in a position corresponding to the pad; forming a via penetrating the optical waveguide; and forming a first electrical wiring layer and a second electrical wiring layer, in which circuit patterns are formed, by etching the first metal clad laminate and the second metal clad laminate.

Here, an optical waveguide can include a core, through which optical signals may travel, and a cladding, which may cover the core. The first electrical wiring layer and the second electrical wiring layer can each include a flexible insulation layer, and a circuit pattern formed on the flexible insulation layer.

Also, the via can be structured to electrically connect the circuit pattern of the first electrical wiring layer, the circuit pattern of the second electrical wiring layer, and the circuit pattern buried in the optical waveguide.

The operation of providing the optical waveguide that has a circuit pattern and at least one pad buried in one side and has an insulation layer stacked over one side can include: providing the insulation layer, on one side of which a metal layer is formed; forming the circuit pattern and the pad by etching portions of the metal layer; and stacking the optical waveguide over the insulation layer such that the circuit pattern and the pad are buried in the optical waveguide. The insulation layer can be made of a flexible material.

The forming of the via can include: forming a via hole that penetrates the optical waveguide, the insulation layer, the first insulating material, the second insulating material, the first metal clad laminate, and the second metal clad laminate; forming a seed layer over an inner wall of the via hole by electroless plating; and forming a plating layer over the seed layer by electroplating.

Portions of the first insulating material and the second insulating material can be removed such that the optical waveguide, the first electrical wiring layer, and the second electrical wiring layer are bendable. The insulation layer may be made of a material containing a light-transmissive substance.

Additional aspects and advantages of the present invention will be set forth in part in the description which follows, and in part will be obvious from the description, or may be learned by practice of the invention.

DETAILED DESCRIPTION

Figure 1:
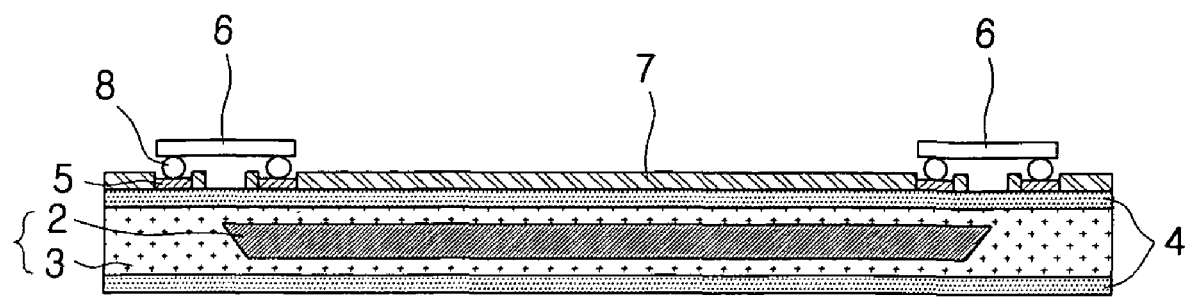
FIG. 1 is a cross sectional view of a printed circuit board according to the related art.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The printed circuit board and method of manufacturing the printed circuit board according to certain embodiments of the invention will be described below in more detail with reference to the accompanying drawings. Those components that are the same or are in correspondence are rendered the same reference numeral regardless of the figure number, and redundant explanations are omitted.

Figure 2:
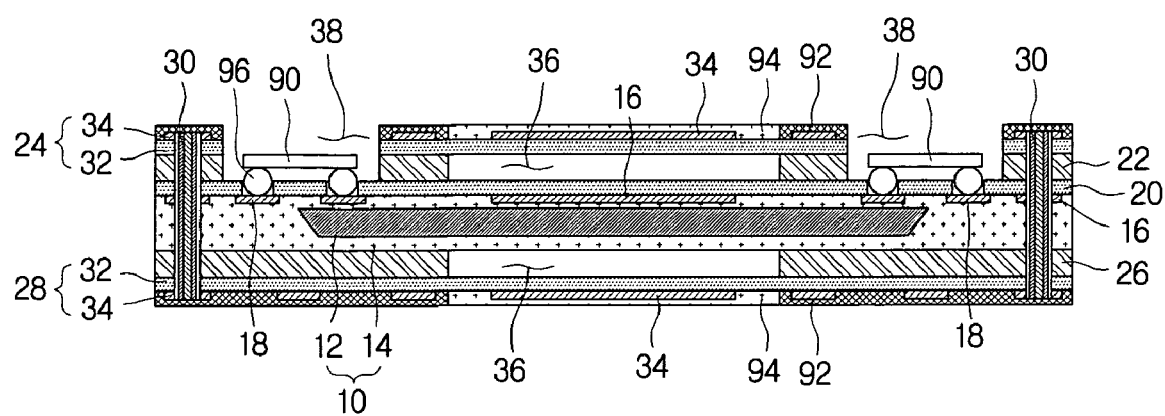
FIG. 2 is a cross sectional view of a printed circuit board according to a first disclosed embodiment of an aspect of the invention.
Figure 3:
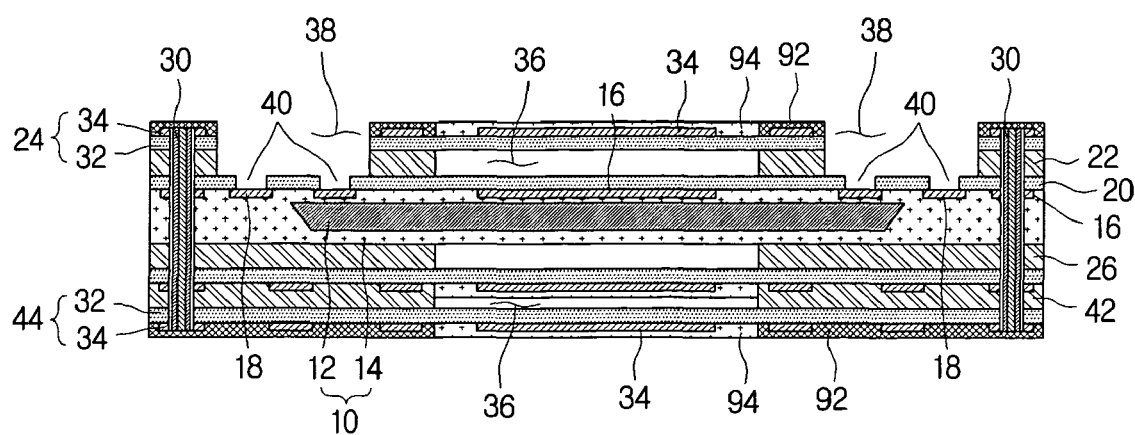
FIG. 3 is a cross sectional view of a printed circuit board according to a second disclosed embodiment of an aspect of the invention.

FIG. 2 is a cross sectional view of a printed circuit board according to a first disclosed embodiment of the invention, and FIG. 3 is a cross sectional view of a printed circuit board according to a second disclosed embodiment of the invention. In FIG. 2 and FIG. 3, there are illustrated an optical waveguide 10, a core 12, a cladding 14, a circuit pattern 16, pads 18, an insulation layer 20, a first insulating material 22, a first electrical wiring layer 24, a second insulating material 26, a second electrical wiring layer 28, vias 30, flexible insulation layers 32, circuit patterns 34, removed portions 36 in the insulating materials, perforated parts 38, uncovered portions 40 in the insulation layer, a third insulating material 42, a third electrical wiring layer 44, photoelectric converters 90, solder resists 92, coverlays 94, and solder balls 96.

According to the first disclosed embodiment of the invention, a printed circuit board can be provided, in which an optical waveguide 10 having a circuit pattern 16 and pads 18 buried in one side may be arranged in a center portion of the board, as illustrated in FIG. 2.

The optical waveguide 10 can be composed of a core 12, through which optical signals may travel, and a cladding 14, which may cover the core. As such, optical signals may be transferred through the core 12 of the optical waveguide, while electrical signals may be transferred through the circuit pattern buried in the cladding 14. The pads 18 can be located in positions where a photoelectric converter 90 may be mounted by way of solder balls or by wire bonding, and can be electrically connected with the circuit pattern 16.

Thus, an optical waveguide capable of transferring both optical and electrical signals may be arranged in a center portion of the board.

Burying the circuit pattern 16 and pads 18 in the cladding of an optical waveguide capable of transferring optical signals, as in the first disclosed embodiment of the invention, allows for higher efficiency in designing the wiring layout.

The core 12 can serve as the path through which optical signals may be transferred, and can be surrounded by the cladding 14. In this embodiment, the core 12 can be made from materials such as flexible polymers and optical fibers.

The cladding 14 can surround the core 12 and enable the efficient transmission of optical signals. The cladding 14 may also be made of a flexible polymer material, as may the core 12. However, for the efficient transfer of optical signals, the cladding 14 may be designed to have a lower refractive index than that of the core 12.

Also, according to this embodiment, an insulation layer 20 can be stacked over one side of the optical waveguide 10 in which the circuit pattern 16 and pads 18 may be buried, a first insulating material 22 can be stacked over the insulation layer 20, and a first electrical wiring layer 24 can be stacked over the first insulating material 22, as illustrated in FIG. 2.

Furthermore, a second insulating material 26 can be stacked over the other side of the optical waveguide 10, and a second electrical wiring layer 28 can be stacked over the second insulating material 26.

Here, the insulation layer 20 stacked over one side of the optical waveguide can be made of a flexible material that allows bending, etc. The insulation layer 20 can serve to cover the circuit pattern 16 and the pads 18. As the insulation layer 20 may be attached to the surface of the optical waveguide where the circuit pattern and pads are located, there may not be a separate insulating material necessary for preventing the circuit pattern and pads from being exposed to the exterior.

In the first disclosed embodiment of the invention, the first electrical wiring layer 24 and the second electrical wiring layer 28 can be the outer circuits formed outside the optical waveguide 10 located in an inner layer of the board. Electrical power or electrical signals may be transmitted through the first and second electrical wiring layers 24, 28.

As illustrated in FIG. 2, the first electrical wiring layer 24 and the second electrical wiring layer 28 based on this embodiment can each include a flexible insulation layer 32 and a circuit pattern 34 formed over the flexible insulation layer 32. Electric signals can be transferred through the circuit patterns of the first and second electrical wiring layers 24, 28.

The first electrical wiring layer 24 and the second electrical wiring layer 28, which may each include a circuit pattern formed over a flexible insulation layer 32, can be such that display bendable characteristics.

As illustrated in FIG. 2, solder resists 92 and coverlays 94 can be used to cover the circuit patterns formed in the first electrical wiring layer 24 and the second electrical wiring layer 28 positioned on the outer layers. This can help maintain reliable circuit patterns 34.

In this embodiment, vias 30 can penetrate the optical waveguide 10 to electrically connect the first and second electrical wiring layers 24, 28 positioned in the outer layers with the optical waveguide 10 positioned in the inner layer. That is, as illustrated in FIG. 2, the vias 30 can electrically connect the circuit pattern of the first electrical wiring layer 24, the circuit pattern of the second electrical wiring layer 28, and the circuit pattern 16 buried in the optical waveguide 10. In this way, interlayer conduction can be implemented between the circuit pattern 16 buried in the optical waveguide 10 and the circuit patterns formed on the outer layers of the optical waveguide 10.

According to this embodiment, a structure of vias 30 that directly connect the electrical wiring in the outer layers and the optical waveguide in the inner layer may be utilized to efficiently transfer optical signals and electrical signals in the optical waveguide layer to the outer layers. Moreover, the electrical signals transmitted from the outer layers may be transferred quickly, using the optical waveguide 10 in the inner layer, as optical signals.

The optical printed circuit board based on this embodiment can include electrical wiring 16, 18 implanted in the optical waveguide 10, and can thus provide higher access efficiency with respect to photoelectric converters 90, as well as better bendability.

As illustrated in FIG. 2, portions of the first insulating material 22 and the second insulating material 26 can be removed, to allow bending in the optical waveguide 10, first electrical wiring layer 24, and second electrical wiring layer 28.

The first insulating material 22 and the second insulating material 26 can be made from rigid insulating materials that may not easily be bent. Thus, the board can be flexible in areas where the first insulating material 22 and second insulating material 26 are partially removed. Conversely, the board may be rigid in areas where the first insulating material 22 and second insulating material 26 are not removed, and overall, a rigid-flexible optical-signal printed circuit board may be provided, in which portions of the board are bendable.

Perforated parts 38 can be formed in the first electrical wiring layer 24 and the first insulating material 22 in positions corresponding to the pads 18 buried in the optical waveguide 10, to enable the mounting of photoelectric converters 90. By mounting the photoelectric converters 90 in the spaces formed by the perforated parts 38, a module that includes a printed circuit board based on this embodiment can be generally reduced in thickness.

Here, a photoelectric converter 90 may be an apparatus for converting electrical signals into optical signals and/or optical signals into electrical signals.

The insulation layer 20 formed over the optical waveguide 10 and covering the circuit pattern 16 can be uncovered in positions corresponding to the pads 18, in such a way that the pads 18 are exposed. With the insulation layer 20 partially uncovered, the pads 18 buried in the optical waveguide 10 may be exposed to the exterior, so that the photoelectric converters 90 may be mounted onto the pads 18 using solder balls or wire bonding.

That is, as described above, the first insulating material 22 and the first electrical wiring layer 24 can include perforated parts 38 to provide spaces in which to mount the photoelectric converters 90. By having the pads 18 of the optical waveguide exposed, the photoelectric converters 90 can be made to access the optical waveguide 10.

The insulation layer 20 stacked over the optical waveguide can be made of a material that contains a light-transmissive substance.

The portions where the perforated parts 38 are formed in the first insulating material 22 and first electrical wiring layer 24 and where the photoelectric converters 90 are to be mounted can be covered with the insulation layer 20, with only the portions of the pads 18 uncovered to be connected to the photoelectric converters 90 by solder balls, etc. Therefore, it may not be necessary to apply and process separate solder resists at the portions where the photoelectric converters 90 are to be mounted.

Since there may be no solder resists employed, it may not be necessary to separately uncover portions lying on the optical paths between the photoelectric converters 90 and the mirrors embedded in the optical waveguide 10. In other words, the high-precision process for uncovering solder resists may not be required.

The insulation layer 20, which may be adhered to the optical waveguide, can employ a light-transmissive material having a high degree of transparency, to lower the optical loss between the photoelectric converters 90 and the mirrors.

As described above, an optical printed circuit board can be provided that includes an optical waveguide 10 capable of transmitting both optical and electrical signals arranged in the inner part of the board, a first electrical wiring layer 24 and a second electrical wiring layer 28 capable of transmitting electrical power and electrical signals arranged in the outer parts of the board, and vias 30 capable of connecting the inner layers of the board with the outer layers of the board. The optical printed circuit board allows for more efficient designs in the electrical wiring and allows lower losses in transmitting optical signals.

According to a second disclosed embodiment of the invention, an optical printed circuit board can be provided, in which three electrical wiring layers may be formed in the outer layers of the optical waveguide 10, as illustrated in FIG. 3.

According to the second disclosed embodiment of the invention, the optical printed circuit board can be provided with an additional outer circuit, by stacking a third insulating material 42 over the second electrical wiring layer 28 of the first disclosed embodiment and stacking a third electrical wiring layer 44 over the third insulating material 42.

Components of this embodiment that are in correspondence with the components of the first disclosed embodiment of the invention described with reference to FIG. 2 may provide the same or similar functions as the components of the first disclosed embodiment and thus will not be described again in detail.

Similar to the other electrical wiring layers 24, 28 described above, the third electrical wiring layer 44 of the second disclosed embodiment of the invention can also include a flexible insulation layer 32, and a circuit pattern 34 formed on the flexible insulation layer 32, to allow the transfer of electrical power and electrical signals.

Also, similar to the first insulating material 22 and second insulating material 26 described for the first disclosed embodiment of the invention, the third insulating material 42 may have certain portions removed, to allow bending in the optical waveguide 10, first electrical wiring layer 24, second electrical wiring layer 28, and third electrical wiring layer 44.

A via 30 penetrating the optical waveguide can be formed as a structure that electrically connects the circuit pattern of the first electrical wiring layer 24, the circuit pattern of the second electrical wiring layer 28, the circuit pattern of the third electrical wiring layer 44, and the circuit pattern 16 buried in the optical waveguide 10. Thus, interlayer conduction can be implemented in-between the three electrical wiring layers 24, 28, 44 and the optical waveguide 10, to provide a simple structure for the optical printed circuit board in which optical signals and electrical signals may readily be transmitted.

Printed circuit boards based on a third disclosed embodiment and a fourth disclosed embodiment of the invention will now be described as follows.

Figure 4:
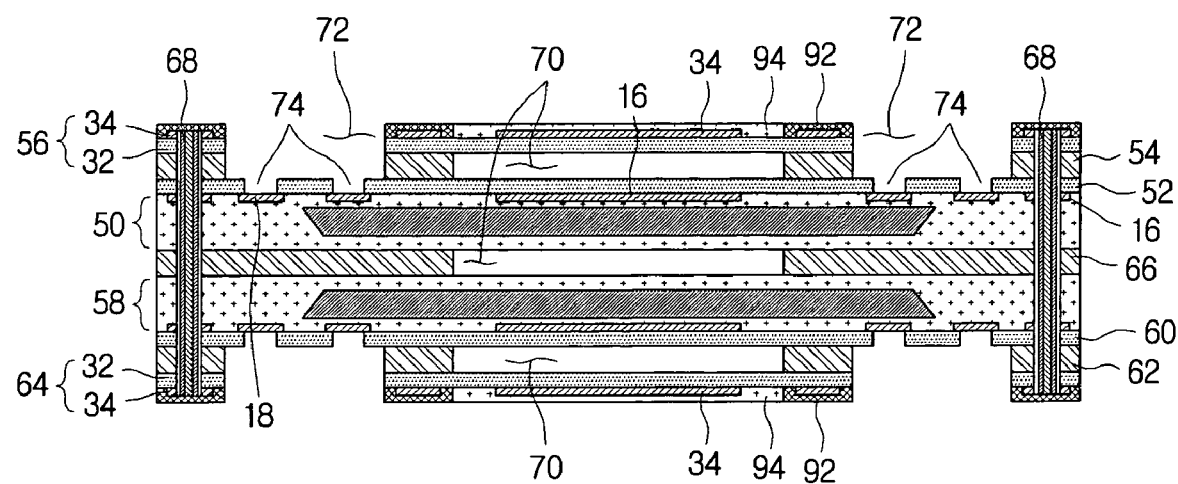
FIG. 4 is a cross sectional view of a printed circuit board according to a third disclosed embodiment of an aspect of the invention.
Figure 5:
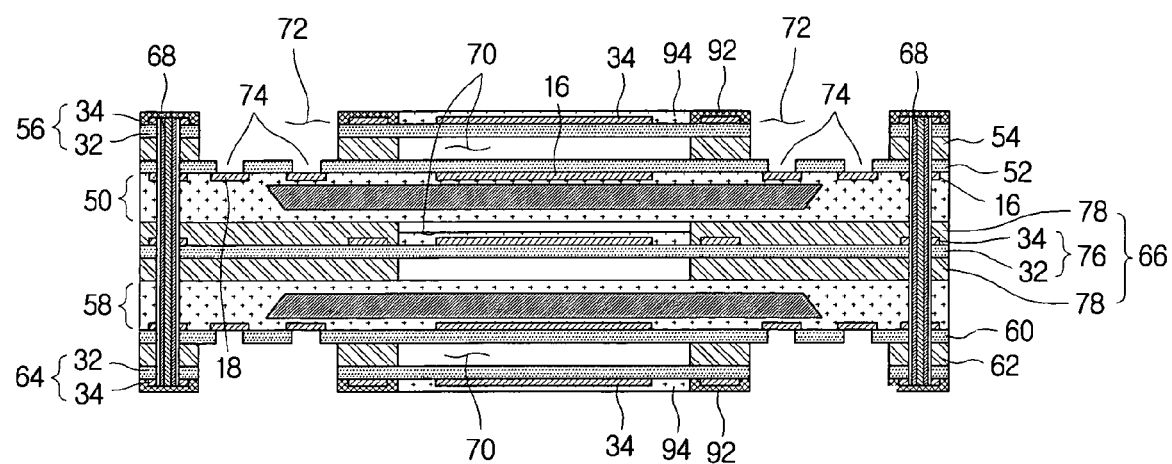
FIG. 5 is a cross sectional view of a printed circuit board according to a fourth disclosed embodiment of an aspect of the invention.

FIG. 4 is a cross sectional view of a printed circuit board according to a third disclosed embodiment of the invention, and FIG. 5 is a cross sectional view of a printed circuit board according to a fourth disclosed embodiment of the invention. In FIG. 4 and FIG. 5, there are illustrated circuit patterns 16, pads 18, flexible insulation layers 32, circuit patterns 34, a first optical waveguide 50, a first insulation layer 52, a first insulating material 54, a first electrical wiring layer 56, a second optical waveguide 58, a second insulation layer 60, a second insulating material 62, a second electrical wiring layer 64, an intermediate layer 66, vias 68, removed portions 70 in the insulating materials and the intermediate layer 66, perforated parts 72, uncovered portions 74 of the first and second insulation layers, a third electrical wiring layer 76, a third insulating material 78, solder resists 92, and coverlays 94.

As illustrated in FIG. 4, according to the third disclosed embodiment of the invention, an optical printed circuit board can be provided that includes two optical waveguides, and two electrical wiring layers formed in the outer layers of the two optical waveguides.

According to this embodiment, optical signals and electrical signals can be transmitted using two optical waveguides formed in the inner layers of the board in the same manner as for the first disclosed embodiment of the invention. By forming two electrical wiring layers, which enable the transfer of electrical signals, in the outer layers of the board, an optical printed circuit board can be provided that is composed of two optical waveguides and two electrical wiring layers.

In the description of this embodiment, different reference numerals are used to indicate corresponding components, in order to clearly distinguish separate components. However, components of this embodiment that are in correspondence with the components of the first disclosed embodiment of the invention described with reference to FIG. 2 may provide the same or similar functions as the components of the first disclosed embodiment and thus will not be described again in detail.

In FIG. 4, an example of a printed circuit board is illustrated, which is composed of a first optical waveguide 50, in one side of which a circuit pattern 16 and pads 18 are buried; a first insulation layer 52 stacked over one side of the first optical waveguide 50; a first insulating material 54 stacked over the first insulation layer 52; a first electrical wiring layer 56 stacked over the first insulating material 54; a second optical waveguide 58, in one side of which a circuit pattern and pads are buried; a second insulation layer 60 stacked over one side of the second optical waveguide 58; a second insulating material 62 stacked over the second insulation layer 60; a second electrical wiring layer 64 stacked over the second insulating material 62; an intermediate layer 66 interposed between the other side of the first optical waveguide 50 and the other side of the second optical waveguide 58, such that the first optical waveguide 50 and the second optical waveguide are attached 58 to each other; and vias 68 penetrating the first optical waveguide 50 and the second optical waveguide 58.

In the third disclosed embodiment of the invention, the first optical waveguide 50 and the second optical waveguide 58 can each include a core, through which optical signals may travel, and a cladding, which may cover the core.

The first optical waveguide 50 and the second optical waveguide 58 may each have a circuit pattern 16 and pads 18 buried in one side, to be capable of transferring both optical signals and electrical signals.

The first optical waveguide 50 and the second optical waveguide 58 may also have a first insulation layer 52 and a second insulation layer 60 stacked over one side, respectively, covering the circuit patterns 16 and pads 18. Here, the first insulation layer 52 and second insulation layer 60 can be made of a flexible material that allows bending.

As in the example shown in FIG. 4, a first insulating material 54 and a second insulating material 62 can be stacked over the first insulation layer 52 and the second insulation layer 60, respectively, while a first electrical wiring layer 56 and a second electrical wiring layer 64 can be formed over the first insulating material 54 and the second insulating material 62, respectively.

In order that the first optical waveguide 50 and the second optical waveguide 58, each of which are stacked with an insulating material and a wiring layer as described above, may be attached to each other, an intermediate layer 66 can be interposed between the other side of the first optical waveguide 50 and the other side of the second optical waveguide 58. In this embodiment, the intermediate layer can be an insulating material that provides insulation between the optical waveguides 50, 58.

A printed circuit board according to this embodiment can be a multi-layer board, in which two optical waveguides as described above are stacked together by way of an intermediate layer. By having two optical waveguides, an optical-signal printed circuit board can be provided that is capable of transferring a higher capacity of optical signals at higher speeds.

In this embodiment, the first and second electrical wiring layers 56, 64 can each be made of a flexible insulation layer 32, and a circuit pattern 34 formed on the flexible insulation layer 32. The first and second electrical wiring layers 56, 64 can be formed in the outer layers over the two optical waveguides 50, 58, to transmit electrical power and electrical signals.

A via 68 penetrating the first optical waveguide 50 and the second optical waveguide 58 can be structured to electrically connect the circuit pattern buried in the first optical waveguide 50, the circuit pattern buried in the second optical waveguide 58, the circuit pattern of the first electrical wiring layer 56, and the circuit pattern of the second electrical wiring layer 64. Thus, interlayer conduction can be implemented between the two optical waveguides 50, 58 and the two electrical wiring layers 56, 64, and an optical printed circuit board can be provided in which a simple wiring structure is utilized for the transmission of optical and electrical signals.

Portions of the first insulating material 54, second insulating material 62, and intermediate layer 66 can be removed, in order to allow bending in the first optical waveguide 50, first electrical wiring layer 56, second optical waveguide 58, and second electrical wiring layer 64.

The first insulating material 54, the second insulating material 62, and the intermediate layer 66 can be made from rigid insulating materials that may not easily be bent. Thus, the board can be flexible in areas where the first insulating material 54 and second insulating material 62 are partially removed. Conversely, the board may be rigid in areas where the first insulating material 54 and second insulating material 62 are not removed, and overall, a rigid-flexible optical-signal printed circuit board may be provided, in which portions of the board are bendable.

Also, perforated parts 72 can be formed in the first electrical wiring layer 56 and the first insulating material 54 in positions corresponding to the pads 18 buried in the first optical waveguide 50, while the first insulation layer 52 can be uncovered in positions corresponding to the pads 18 buried in the first optical waveguide 50 such that the pads 18 are exposed. The first insulation layer 52 can be made of a material containing a light-transmissive substance. This structure, in which perforated parts 72 are formed and the pads 18 are exposed, allows the mounting of photoelectric converters, while reducing loss in the optical signals.

As illustrated in FIG. 4, a printed circuit board according to the third disclosed embodiment of the invention can include perforated parts formed also in the second electrical wiring layer 64 and the second insulating material 62, in which to mount photoelectric converters.

According to a fourth disclosed embodiment of the invention, an optical printed circuit board can be provided, in which an electrical wiring layer may be formed between two optical waveguides and two electrical wiring layers may be formed in the outer layers, as in the example shown in FIG. 5.

According to the fourth disclosed embodiment of the invention, the intermediate layer 66 illustrated in the third disclosed embodiment can include a third electrical wiring layer 76 and third insulating materials 78 stacked over both sides of the third electrical wiring layer 76, to provide an optical printed circuit board that has a third electrical wiring layer 76 added between the two optical waveguides 50, 58.

Components of this embodiment that are in correspondence with the components of the third disclosed embodiment of the invention described with reference to FIG. 5 may provide the same or similar functions as the components of the third disclosed embodiment and thus will not be described again in detail.

Similar to the other electrical wiring layers 56, 64 described above, the third electrical wiring layer 76 of the fourth disclosed embodiment of the invention can also include a flexible insulation layer 32, and a circuit pattern 34 formed on the flexible insulation layer 32, to allow the transfer of electrical power and electrical signals.

Also, similar to the first insulating material 22 and second insulating material 26 described for the first disclosed embodiment of the invention, the third insulating material 78 may have certain portions removed, to allow bending in the first optical waveguide 50, second optical waveguide 58, first electrical wiring layer 56, second electrical wiring layer 64, and third electrical wiring layer 76.

Vias 68 penetrating both sides of the first optical waveguide 50 and both sides of the second optical waveguide 58 can be formed to electrically connect the circuit pattern buried in the first optical waveguide 50, the circuit pattern buried in the second optical waveguide 58, the circuit pattern of the first electrical wiring layer 56, the circuit pattern of the second electrical wiring layer 64, and the circuit pattern of the second electrical wiring layer 76. Thus, interlayer conduction can be implemented in-between the three electrical wiring layers 56, 64, 76 and the two optical waveguides 50, 58, to provide a simple structure for the optical printed circuit board in which optical signals and electrical signals may readily be transmitted.

Figure 6:
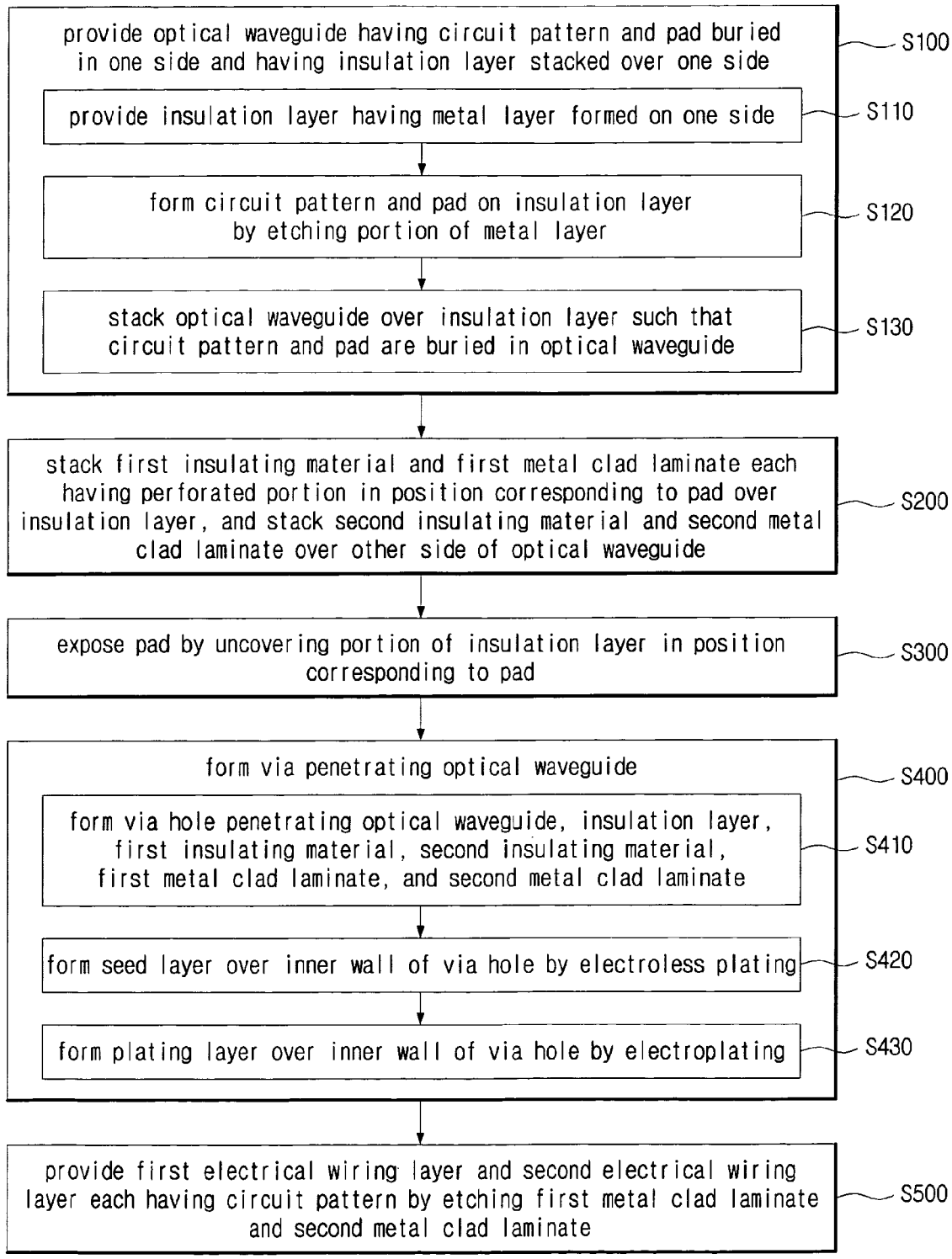
FIG. 6 is a flowchart illustrating a method of manufacturing a printed circuit board according to an embodiment of another aspect of the invention.

A description will be provided as follows on a method of manufacturing a printed circuit board according to the first disclosed embodiment of the invention. FIG. 6 is a flowchart illustrating a method of manufacturing a printed circuit board according to an embodiment of another aspect of the invention, while FIG. 7 through FIG. 16 are cross sectional views representing a flow diagram for a method of manufacturing a printed circuit board according to an embodiment of another aspect of the invention. In FIG. 7 to FIG. 16, there are illustrated an optical waveguide 10, a core 12, a cladding 14, a circuit pattern 16, pads 18, an insulation layer 20, a first insulating material 22, a first electrical wiring layer 24, a second insulating material 26, a second electrical wiring layer 28, vias 30, flexible insulation layers 32, metal layers 33, circuit patterns 34, removed portions 36 in the insulating materials, perforated parts 38, uncovered portions 40 of the insulation layer, a third insulating material 42, a third electrical wiring layer 44, a first metal clad laminate 80, a second metal clad laminate 82, a metal layer 84, via holes 86, seed layers 88, photoelectric converters 90, solder resists 92, and coverlays 94.

The descriptions below will follow the flow of the manufacturing process for the printed circuit board, with reference to the corresponding drawings.

First, an optical waveguide 10 can be provided, which has a circuit pattern 16 and pads 18 buried in one side, and which has an insulation layer 20 stacked over one side (S100).

Figure 7:
FIG. 7, FIG. 8, FIG. 9, FIG. 10, FIG. 11, FIG. 12, FIG. 13, FIG. 14, FIG. 15, and FIG. 16 are cross sectional views representing a flow diagram for a method of manufacturing a printed circuit board according to an embodiment of another aspect of the invention.

The operation of providing an optical waveguide 10 that has a circuit pattern 16 and pads 18 buried in one side and an insulation layer 20 stacked over one side can be performed in the following manner. First, as illustrated in FIG. 7, an insulation layer 20 can be provided that has a metal layer 84 formed over one side (S110). In this embodiment, the insulation layer 20 can be made of a flexible material that allows bending, and can be made of a material that includes a light-transmissive substance. As described above, by using a transparent insulation layer 20, optical loss can be reduced between the board and the photoelectric converters.

Figure 8:
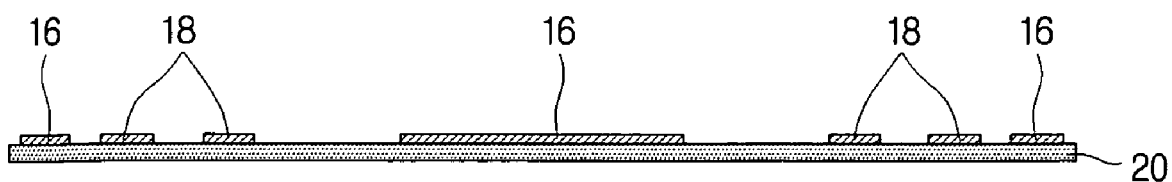

Then, as illustrated in FIG. 8, portions of the metal layer 84 can be etched, to form the circuit pattern 16 and pads 18 on the insulation layer 20 (S120). The process for forming the circuit pattern 16 and pads 18 can include forming an etching resist over the metal layer 84 and then etching the exposed portions of the metal layer 84, in accordance with typical procedures for forming circuit patterns.

Figure 9:
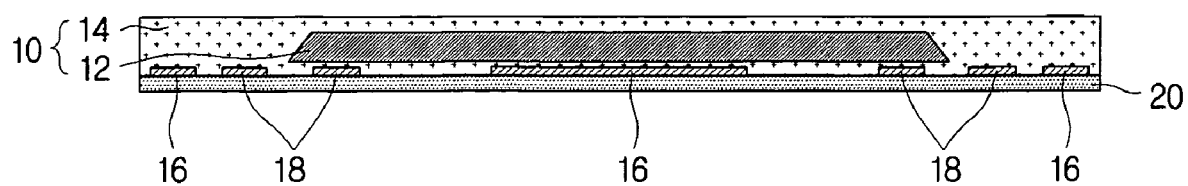

Then, as illustrated in FIG. 9, an optical waveguide 10 can be stacked over the insulation layer 20 in such a way that the circuit pattern 16 and the pads 18 are buried in the optical waveguide 10 (S130). The optical waveguide 10 can be composed of a core 12, through which optical signals may travel, and a cladding 14, which may surround the core 12. The circuit pattern 16 and the pads 18 can be buried in the cladding 14 of the optical waveguide 10 by pressing the optical waveguide 10 onto the insulation layer 20 on which the circuit pattern 16 and pads 18 are formed.

Figure 10:
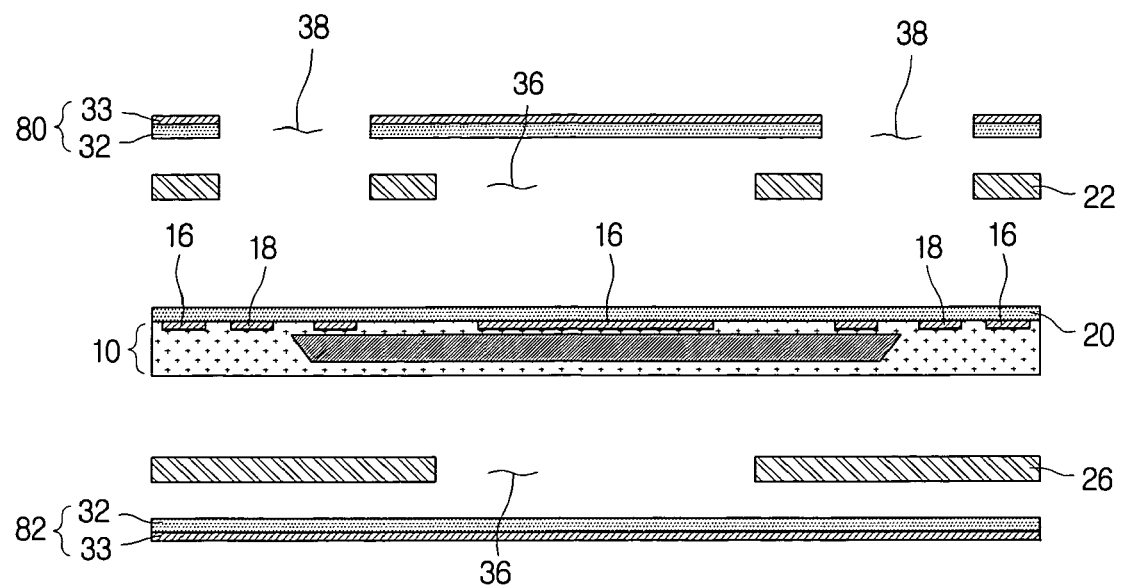
Figure 11:
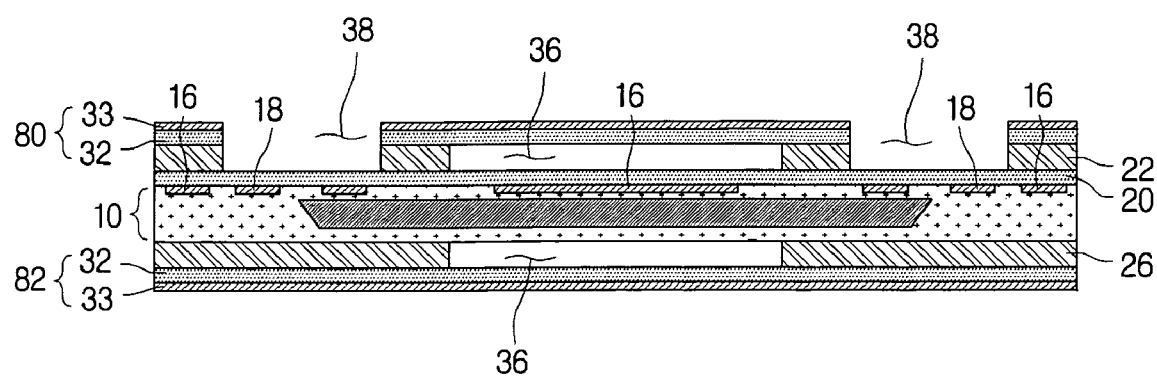

Then, as illustrated in FIG. 10 and FIG. 11, a first insulating material 22 and a first metal clad laminate 80, each having perforated parts 38 in positions corresponding to the pads 18, can be stacked over the insulation layer 20, and a second insulating material 26 and a second metal clad laminate 82 can be stacked over the other side of the optical waveguide 10 (S200).

With respect to the optical waveguide 10 and the stacked insulation layer 20, the first insulating material 22 and the first metal clad laminate 80 having perforated parts 38 in positions corresponding to the pads 18 can be arranged in the direction of the insulation layer 20, while the second insulating material 26 and the second metal clad laminate 82 can be arranged in the direction of the other side of the optical waveguide 10, as in FIG. 10. Then, a high-temperature and high-pressure stacking process can be performed, to obtain the stacked configuration as illustrated in FIG. 1.

In this embodiment, the first metal clad laminate 80 and the second metal clad laminate 82 can each be made of a flexible insulation layer 32, and a metal layer 33 stacked over the flexible insulation layer 32.

Portions of the first insulating material 22 and the second insulating material 26 can be removed, in order that the optical waveguide 10, first electrical wiring layer 24, and second electrical wiring layer 28, formed after the stacking process as illustrated in FIG. 10 and FIG. 11, may be bendable. The rigid-flexible optical printed circuit board structure, obtained by removing portions of the first insulating material 22 and second insulating material 26, is as already described above.

Figure 12:
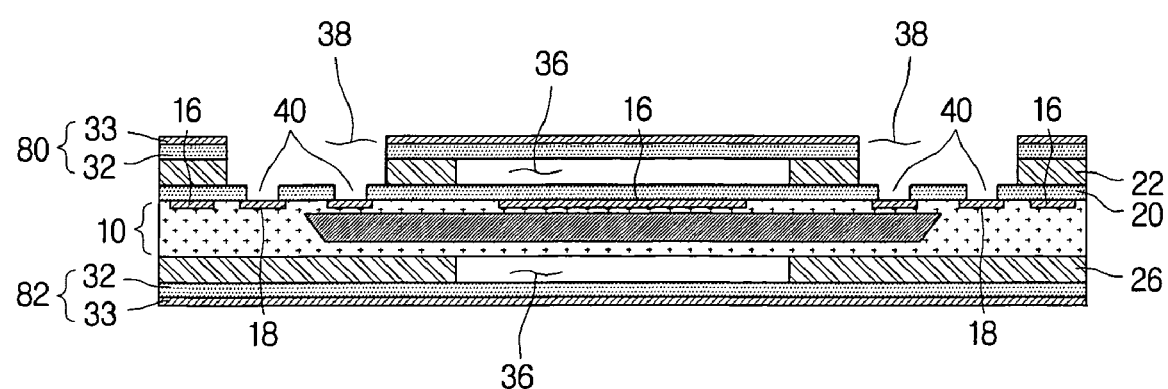

As illustrated in FIG. 12, the pads 18 can be exposed by uncovering portions of the insulation layer 20 in positions corresponding to the pads 18 (S300). Partially removing the insulation layer 20 can be achieved by etching the portions corresponding to the pads 18 using laser, etc.

Whereas this embodiment is described using an example in which the process for exposing the pads 18 by uncovering portions of the insulation layer 20 is performed before the operation of forming via holes 86, which will be described later on, it is also possible to perform the uncovering process after the via holes are formed and before the circuit patterns of the outer electrical wiring layers are formed. Forming the via holes 86 after uncovering the pads 18 as in this example, however, provides the advantage of obviating the need for a post-treatment process on the surface after uncovering the pads 18.

Next, vias 30 can be formed that penetrate the optical waveguide 10 (S400). Forming the vias 30 can include the following operations.

Figure 13:
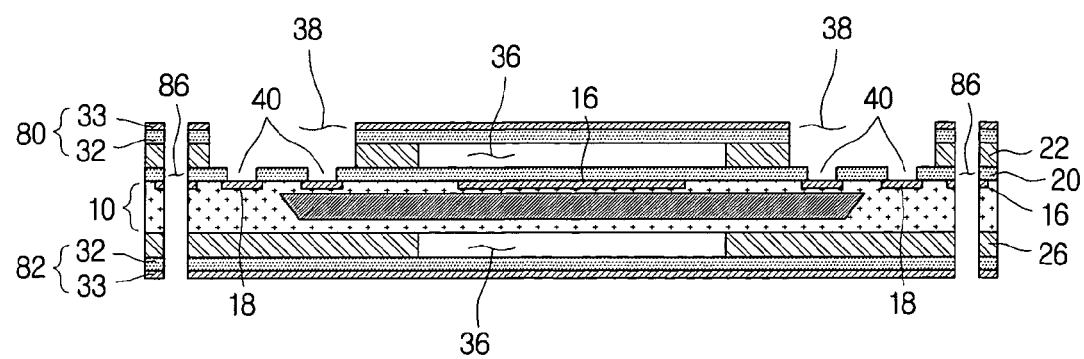

First, as illustrated in FIG. 13, via holes 86 can be formed, which penetrate the optical waveguide 10, insulation layer 20, first insulating material 22, second insulating material 26, first metal clad laminate 80, and second metal clad laminate 82 (S410). The via holes 86 can be formed using a drilling process, etc.

In the description for certain embodiments of the invention, a via hole 86 may refer to a hole processed in the optical waveguide 10, insulation layer 20, first insulating material 22, second insulating material 26, first metal clad laminate 80, and second metal clad laminate 82, in a preliminary operation for implementing interlayer conduction in the board, while a via 30 may refer to an interlayer conduction channel implemented in the board by depositing a conductive material over the inner wall of a via hole 86.

Figure 14:
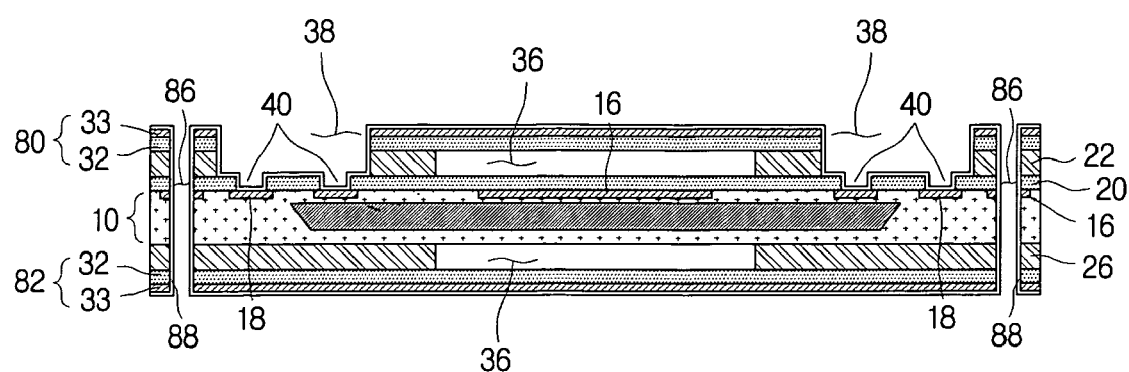

Next, as illustrated in FIG. 14, seed layers 88 can be formed over the inner walls of the via holes 86 by applying electroless plating (S420). The seed layers 88 may serve as the foundations for depositing a conductive material inside the via holes 86.

Figure 15:
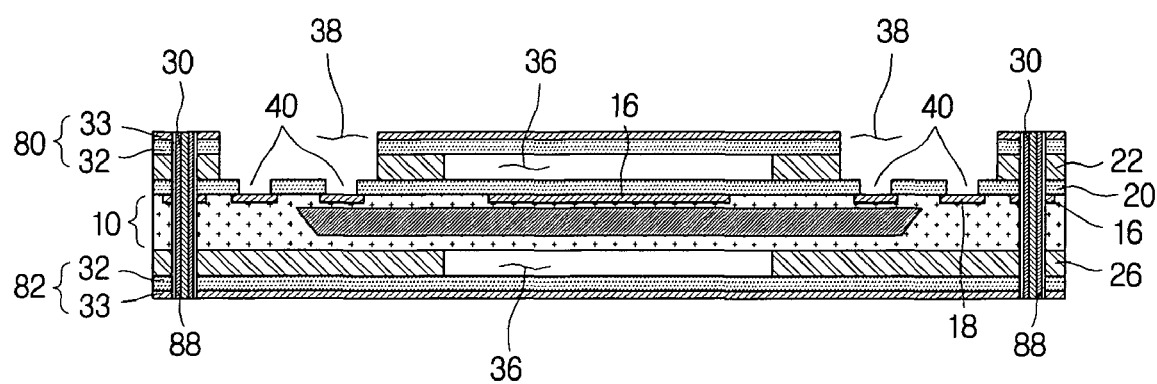

Next, as illustrated in FIG. 15, the inner walls of the via holes 86 can be plated, using electroplating (S430). By performing the electroplating, layers of plating can be formed over the inner walls of the via holes 86 on which the seed layers 88 are formed. Afterwards, the insides of the via holes can be filled with an insulating material, or can be filled in with a conductive material by fill plating, to provide vias 30 for interlayer conduction, as illustrated in FIG. 16.

In the manner illustrated in FIGS. 13 to 15, the vias 30 can be formed, which electrically connect the circuit pattern of the first electrical wiring layer 24, the circuit pattern of the second electrical wiring layer 28, and the circuit pattern buried in the optical waveguide 10.

Figure 16:
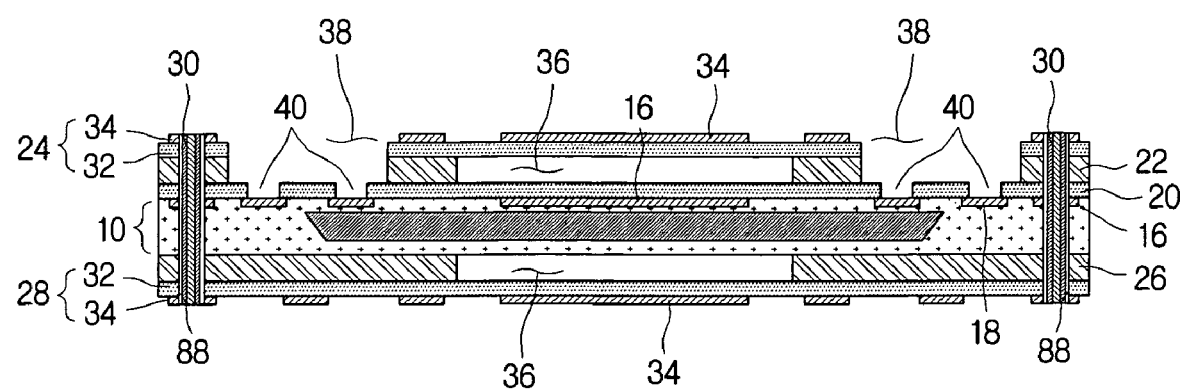

Next, as illustrated in FIG. 16, a first electrical wiring layer 24 and a second electrical wiring layer 28 each having a circuit pattern 34 can be provided, by etching the first metal clad laminate 80 and the second metal clad laminate 82 (S500).

The process for forming the circuit patterns 34 of the first and second electrical wiring layers 24, 28 can include forming an etching resist over the first and second metal clad laminates 80, 82 and then etching the exposed portions of the first and second metal clad laminates 80, 82, in accordance with typical procedures for forming circuit patterns.

The procedures described above can be utilized to provide a printed circuit board that yields high connection efficiency to photoelectric converters, allows efficient wiring design, and reduces loss in optical signals.

Many embodiments other than those set forth above can be found in the appended claims. While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A printed circuit board comprising:
    an optical waveguide having a circuit pattern and a pad buried in one side thereof;
    an insulation layer stacked over one side of the optical waveguide;
    a first insulating material stacked over the insulation layer and having perforated parts formed therein in positions corresponding to the pad;
    a first electrical wiring layer stacked over the first insulating material and having perforated parts formed therein in positions corresponding to the pad;
    a second insulating material stacked over the other side of the optical waveguide;
    a second electrical wiring layer stacked over the second insulating material; and
    a via penetrating the optical waveguide.

2. The printed circuit board of claim 1, wherein the insulation layer is flexible.

3. The printed circuit board of claim 1, wherein each of the first electrical wiring layer and the second electrical wiring layer comprises:
    a flexible insulation layer; and
    a circuit pattern formed on the flexible insulation layer.

4. The printed circuit board of claim 3, wherein the via electrically connects the circuit pattern of the first electrical wiring layer, the circuit pattern of the second electrical wiring layer, and the circuit pattern buried in the optical waveguide.

5. The printed circuit board of claim 1, wherein the first insulating material and the second insulating material have portions thereof removed such that the optical waveguide, the first electrical wiring layer, and the second electrical wiring layer are bendable.

6. The printed circuit board of claim 1, wherein the insulation layer is uncovered in a position corresponding to the pad such that the pad is exposed.

7. The printed circuit board of claim 6, wherein the insulation layer is made of a material containing a light-transmissive substance.

8. The printed circuit board of claim 3, further comprising:
    a third insulating material stacked over the second electrical wiring layer; and
    a third electrical wiring layer stacked over the third insulating material.

9. The printed circuit board of claim 8, wherein the third electrical wiring layer comprises:
    a flexible insulation layer; and
    a circuit pattern formed on the flexible insulation layer.

10. The printed circuit board of claim 9, wherein the via electrically connects the circuit pattern of the first electrical wiring layer, the circuit pattern of the second electrical wiring layer, the circuit pattern of the third electrical wiring layer, and the circuit pattern buried in the optical waveguide.

* * * * *

UNITED STATES PATENT AND TRADEMARK OFFICE
CERTIFICATE OF CORRECTION

| | | |
|---|---|---|
| PATENT NO. | : 7,809,220 B2 | |
| APPLICATION NO. | : 12/219135 | |
| DATED | : October 5, 2010 | |
| INVENTOR(S) | : Sang-Hoon Kim et al. | |

It is certified that error appears in the above-identified patent and that said Letters Patent is hereby corrected as shown below:

On the title page, item [56] Col. 2 (Other Publications), Line 2 Delete "Applicatiion" and insert -- Application --, therefor Signed and Sealed this
Third Day of May, 2011

David J. Kappos
*Director of the United States Patent and Trademark Office*